United States Patent
Tseng et al.

(10) Patent No.: US 11,495,149 B2
(45) Date of Patent: Nov. 8, 2022

(54) DISPLAY APPARATUS

(71) Applicant: PlayNitride Display Co., Ltd., MiaoLi County (TW)

(72) Inventors: Chun-Ming Tseng, MiaoLi County (TW); Wei-Ping Lin, MiaoLi County (TW); Po-Jen Su, MiaoLi County (TW); Gwo-Jiun Sheu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 73 days.

(21) Appl. No.: 17/185,828

(22) Filed: Feb. 25, 2021

(65) Prior Publication Data

US 2022/0058994 A1 Feb. 24, 2022

Related U.S. Application Data

(60) Provisional application No. 63/069,693, filed on Aug. 24, 2020.

(30) Foreign Application Priority Data

Dec. 23, 2020 (TW) ................................. 109145631

(51) Int. Cl.
  *G09F 9/302* (2006.01)
  *G09F 9/33* (2006.01)
  (Continued)

(52) U.S. Cl.
  CPC .............. *G09F 9/3026* (2013.01); *G09F 9/33* (2013.01); *H01L 27/156* (2013.01); *H01L 33/486* (2013.01); *H01L 33/62* (2013.01)

(58) Field of Classification Search
  None
  See application file for complete search history.

(56) References Cited

U.S. PATENT DOCUMENTS 10,720,415 B2 * 7/2020 Chu .................... H01L 25/167
10,964,678 B2 * 3/2021 Moilanen ................. F21K 9/90
(Continued)

FOREIGN PATENT DOCUMENTS

CN 1291353 4/2001
CN 1291353 A * 4/2001 ......... G02F 1/13336
(Continued)

OTHER PUBLICATIONS

"Office Action of Taiwan Counterpart Application", dated Aug. 4, 2021, p. 1-p. 4.

*Primary Examiner* — Vinh T Lam
(74) *Attorney, Agent, or Firm* — JCIPRNET

(57) ABSTRACT

A display apparatus includes a first circuit board and a plurality of first light emitting display units. The first circuit board has a first surface and a first board edge connected to the first surface. The first light emitting display units are disposed on the first surface. Each of the first light emitting display units has a plurality of first pixel areas and includes a first driving circuit layer electrically bonded to the first circuit board and a plurality of first light emitting devices. The first light emitting devices are disposed on one side of the first driving circuit layer away from the first circuit board and are electrically bonded to the first driving circuit layer. At least one of the first light emitting display units has a first side edge parallel to the first board edge. The first board edge is drawn back from the first side edge.

14 Claims, 9 Drawing Sheets

(51) Int. Cl.
    *H01L 33/48*     (2010.01)
    *H01L 33/62*     (2010.01)
    *H01L 27/15*     (2006.01)

(56) References Cited

U.S. PATENT DOCUMENTS

| | | | |
|---|---|---|---|
| 11,081,538 B2 * | 8/2021 | Choi | H01L 27/3262 |
| 11,195,970 B2 * | 12/2021 | Yu | G09F 9/3026 |
| 2020/0381602 A1 * | 12/2020 | Yoshinaga | H01L 33/62 |
| 2021/0296394 A1 * | 9/2021 | Meng | H01L 27/156 |
| 2022/0037296 A1 * | 2/2022 | Yeon | H01L 25/162 |

FOREIGN PATENT DOCUMENTS

| | | | | |
|---|---|---|---|---|
| CN | 102982744 | | 3/2013 | |
| CN | 110379322 | | 10/2019 | |
| CN | 110379322 A | * | 10/2019 | G09F 9/301 |
| CN | 110910777 A | * | 3/2020 | G09F 9/3026 |
| CN | 111029453 A | * | 4/2020 | H01L 25/075 |
| CN | 111048656 A | * | 4/2020 | H01L 25/075 |
| CN | 111128048 A | * | 5/2020 | G09F 9/3026 |
| CN | 112885245 A | * | 6/2021 | G09F 9/33 |
| KR | 20170116632 | | 10/2017 | |
| TW | M480747 | | 6/2014 | |

\* cited by examiner

DISPLAY APPARATUS

CROSS-REFERENCE TO RELATED APPLICATION

This application claims the priority benefits of U.S. provisional application Ser. No. 63/069,693, filed on Aug. 24, 2020, and Taiwan application serial no. 109145631, filed on Dec. 23, 2020. The entirety of each of the above-mentioned patent applications is hereby incorporated by reference herein.

BACKGROUND

Technical Field

The disclosure relates to a display technology, and in particular, relates to a spliced display apparatus.

Description of Related Art

As applications of display apparatuses gradually diversified, the use of large display boards for displaying public messages or advertisements in major exhibition halls or department stores has become increasingly popular. In order to reduce the costs of installation and maintenance of these large display boards, adoption of a spliced display apparatus formed by splicing of multiple display panels has become one of the common mounting methods for these large display boards. Generally, the display panels (such as liquid crystal display panels or light emitting diode panels) of a spliced display apparatus have non-display regions located around the display regions. These non-display regions adjacent to the splicing region of two adjacent display panels may easily form discontinuity (e.g., dark lines) of visual image in the display screen of the spliced display apparatus.

In order to reduce the above-mentioned image discontinuity, light emitting diode panels are gradually gaining popularity due to their narrow frame width. Although the periphery of a light emitting diode panel does not need to be provided with a frame adhesive for sealing liquid crystal used in a liquid crystal display panel, a certain space is still reserved at the periphery of the panel to satisfy process requirements. This reserved space may still form discontinuity of visual image in the display screen of the spliced display apparatus. Therefore, how to solve the foregoing problem is an important issue in the industry in the development of the splicing display technology.

SUMMARY

The disclosure provides a display apparatus capable of providing large-scale display with favorable display quality and production yield.

The disclosure provides a display apparatus including a first circuit board and a plurality of first light emitting display units. The first circuit board has a first surface and a first board edge connected to the first surface. The first light emitting display units are disposed on the first surface of the first circuit board. Each of the first light emitting display units has a plurality of first pixel areas and includes a first driving circuit layer and a plurality of first light emitting devices. The first driving circuit layer is electrically bonded to the first circuit board. The first light emitting devices are disposed on one side of the first driving circuit layer away from the first circuit board and are electrically bonded to the first driving circuit layer. The first light emitting devices are located in the first pixel areas. At least one of the first light emitting display units has a first side edge parallel to the first board edge. The first board edge of the first circuit board is drawn back from the first side edge of the at least one of the first light emitting display units.

In an embodiment of the disclosure, the first pixel areas of the first light emitting display units of the display apparatus are spaced at intervals of a first pitch P1 in a direction. A first spacing S1 is provided between the first side edge of the at least one of the first light emitting display units and the first board edge of the first circuit board in the direction, and a following formula of $0 < S1 \leq 0.2 \cdot P1$ is satisfied.

In an embodiment of the disclosure, the first pixel areas of each of the first light emitting display units of the display apparatus arranged into a plurality of pixel strings at intervals of a first pitch P1 in a direction. A number of the first pixel areas contained in the pixel string extending in the direction is N. The first light emitting display units are arranged at intervals of a second pitch P2 in the direction, and a following formula of $P2 = N \cdot P1$ is satisfied.

In an embodiment of the disclosure, each of the first light emitting display units of the display apparatus has a length L in the direction, and a following formula of $(N-0.4) \cdot P1 < L \leq P2$ is satisfied.

In an embodiment of the disclosure, a gap is provided between any adjacent two first light emitting display units of the display apparatus. A filler fills the gap, and the filler is a black adhesive material.

In an embodiment of the disclosure, a part of the first light emitting devices located in each of the first pixel areas of the display apparatus emit light of different colors.

In an embodiment of the disclosure, the first driving circuit layer of the display apparatus includes a first metal layer and a second metal layer. The first metal layer is disposed on one side of the first driving circuit layer. The first metal layer has a plurality of conductive patterns, and the first light emitting devices are electrically bonded to the conductive patterns. The second metal layer is disposed on another side of the first driving circuit layer. The second metal layer has a plurality of pad patterns, and the first driving circuit layer is electrically bonded to the first circuit board through the pad patterns. The conductive patterns of the first metal layer are electrically connected to the pad patterns of the second metal layer.

In an embodiment of the disclosure, each of the first light emitting display units of the display apparatus has a color mixing layer disposed on one side of the first light emitting devices away from the first driving circuit layer.

In an embodiment of the disclosure, the display apparatus further includes a second circuit board and a plurality of second light emitting display units. The second circuit board has a second surface and a second board edge connected to the second surface. The first board edge of the first circuit board and the second board edge of the second circuit board are opposite to each other. The second light emitting display units are disposed on the second surface of the second circuit board. Each of the second light emitting display units has a plurality of second pixel areas and includes a second driving circuit layer and a plurality of second light emitting devices. The second driving circuit layer is electrically bonded to the second circuit board. The second light emitting devices are disposed on one side of the second driving circuit layer away from the second circuit board and are electrically bonded to the second driving circuit layer. The second light emitting devices are respectively located in the second pixel areas. One of the second light emitting display units has a second side edge parallel to the second board edge, and the second side edge and the first side edge of the at least one of the first light emitting display units are opposite to each other. The second board edge of the second circuit board is drawn back from the second side edge of the one of the second light emitting display units. The first light emitting display units and the second light emitting display units respectively on the first circuit board and the second circuit board are spliced and present an image. The first light emitting display units and the second light emitting display units are arranged in a direction. A first distance is provided between adjacent first light emitting display unit and the second light emitting display unit in the direction. A second distance is provided between the first board edge of the first circuit board and the second board edge of the second circuit board, and the second distance is greater than the first distance.

In an embodiment of the disclosure, the first pixel areas of the first light emitting display units and the second pixel areas of the second light emitting display units are spaced at intervals of a first pitch in a direction in the display apparatus. The first light emitting display units and the second light emitting display units are arranged at intervals of a second pitch in the direction, and the second pitch is an integer multiple of the first pitch.

In an embodiment of the disclosure, the display apparatus further includes at least one connecting member disposed in a gap between the first board edge of the first circuit board and the second board edge of the second circuit board to fixedly connect the first circuit board and the second circuit board. The one of the first light emitting display units and the one of the second light emitting display units overlap the gap.

In an embodiment of the disclosure, sizes of the first circuit board and the second circuit board of the display apparatus are different.

In an embodiment of the disclosure, a length of each of the first light emitting display units is different from a length of each of the second light emitting display units in the display apparatus.

In an embodiment of the disclosure, the first pixel areas and the second pixel areas are arranged at intervals of a same pitch in the display apparatus.

To sum up, in the display apparatus by an embodiment of the disclosure, the light emitting display units are provided with the driving circuit layers. In this way, the margin of circuit design of the display apparatus is increased, and the bonding region of the light emitting display units for electrically bonding the circuit boards may also be effectively reduced. As such, the light emitting display units located around the circuit boards may overlap the board edges of the circuit boards. Accordingly, seamless splicing of the light emitting display units on the circuit boards may be accomplished, and display quality of the large-sized display apparatus is thereby improved. From another perspective, through the electrical bonding of the light emitting display units and the circuit boards, difficulty of repairing of the display apparatus may be lowered. In other words, probability of the display apparatus being scrapped due to failure of transposition (transferring and positioning) of part of the light emitting devices may be effectively reduced, and the production yield of the display apparatus is therefore improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
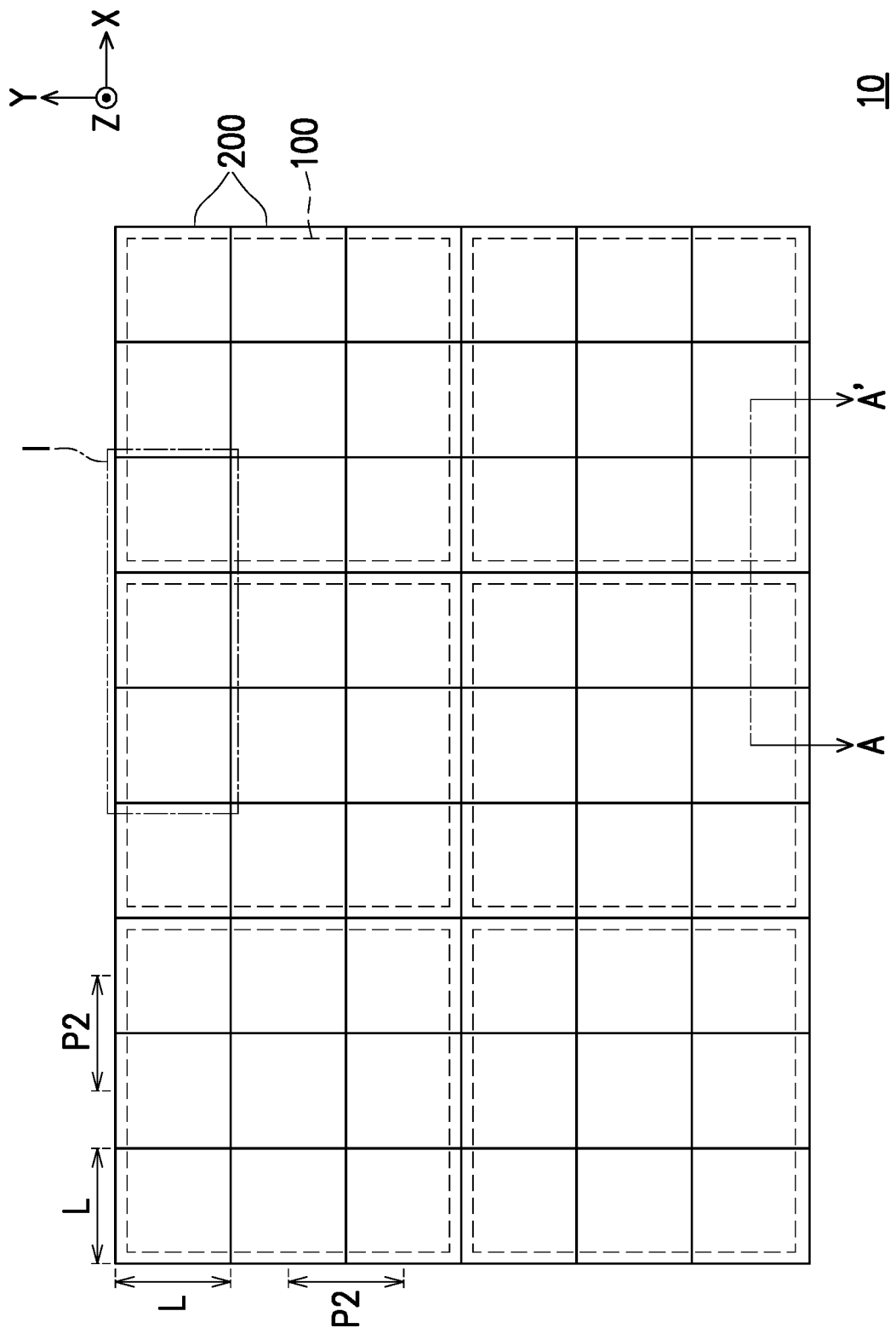
FIG. 1 is a front schematic view of a display apparatus according to a first embodiment of the disclosure.

In the accompanying drawings, thicknesses of layers, films, panels, regions and so on are exaggerated for clarity. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected (or coupled). Therefore, the electrical connection between two devices may include intervening elements existing between the two devices.

Descriptions of the disclosure are given with reference to the exemplary embodiments illustrated by the accompanying drawings. Wherever possible, the same reference numbers are used in the drawings and the description to refer to the same or like parts.

Figure 2:
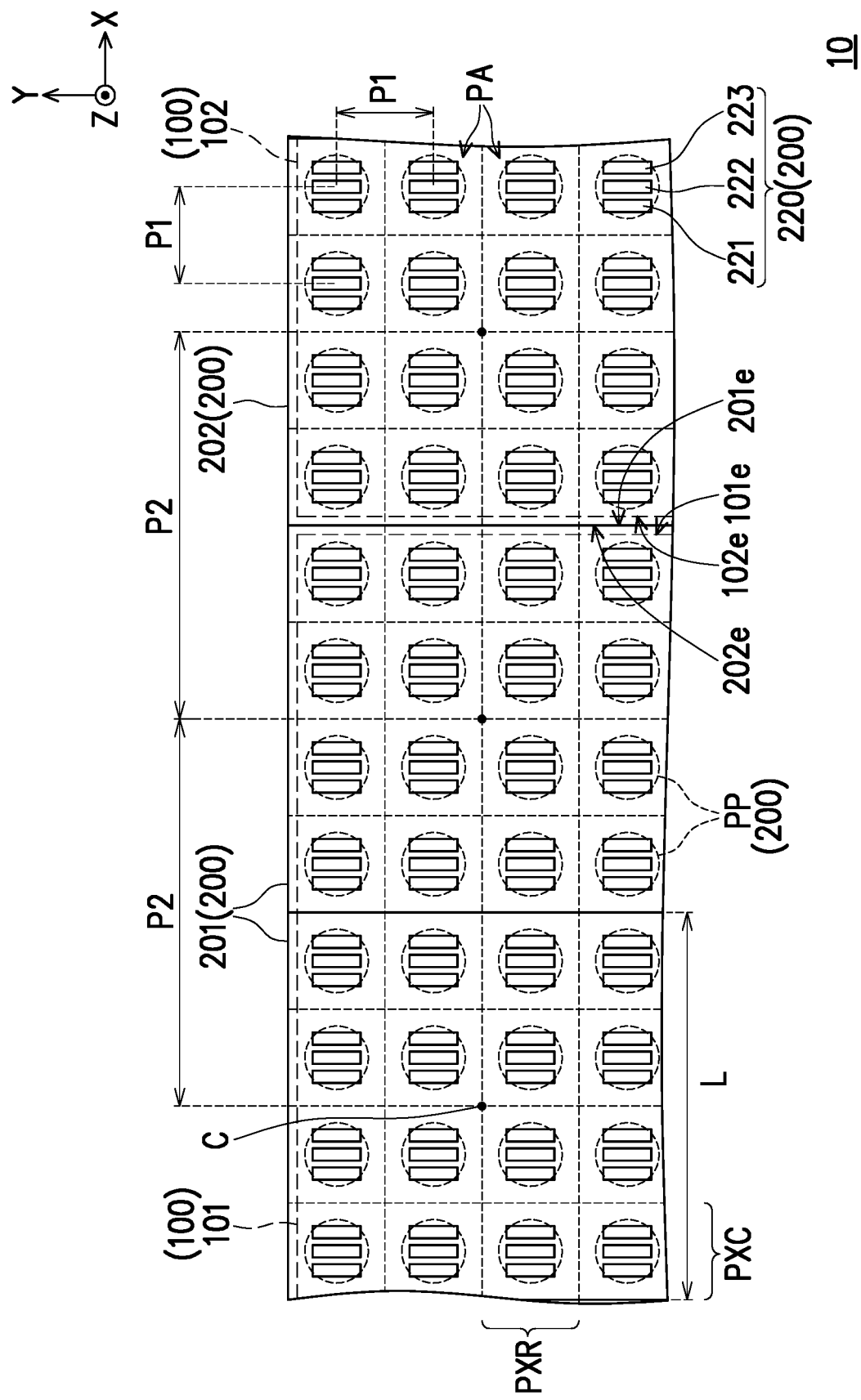
FIG. 2 is an enlarged schematic view of a local region of the display apparatus of FIG. 1.
Figure 3:
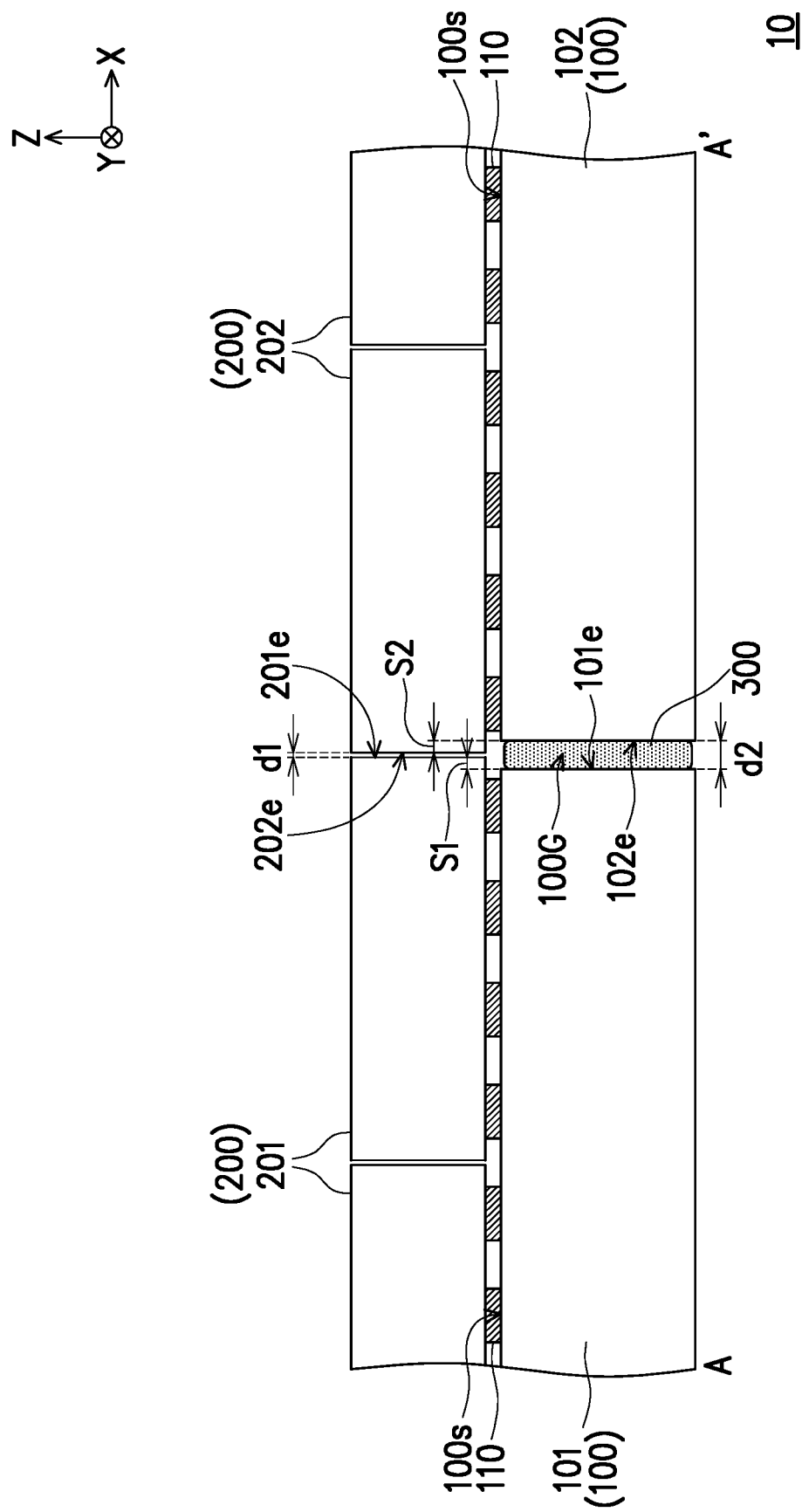
FIG. 3 is a cross-sectional schematic view of the display apparatus of FIG. 1.
Figure 4:
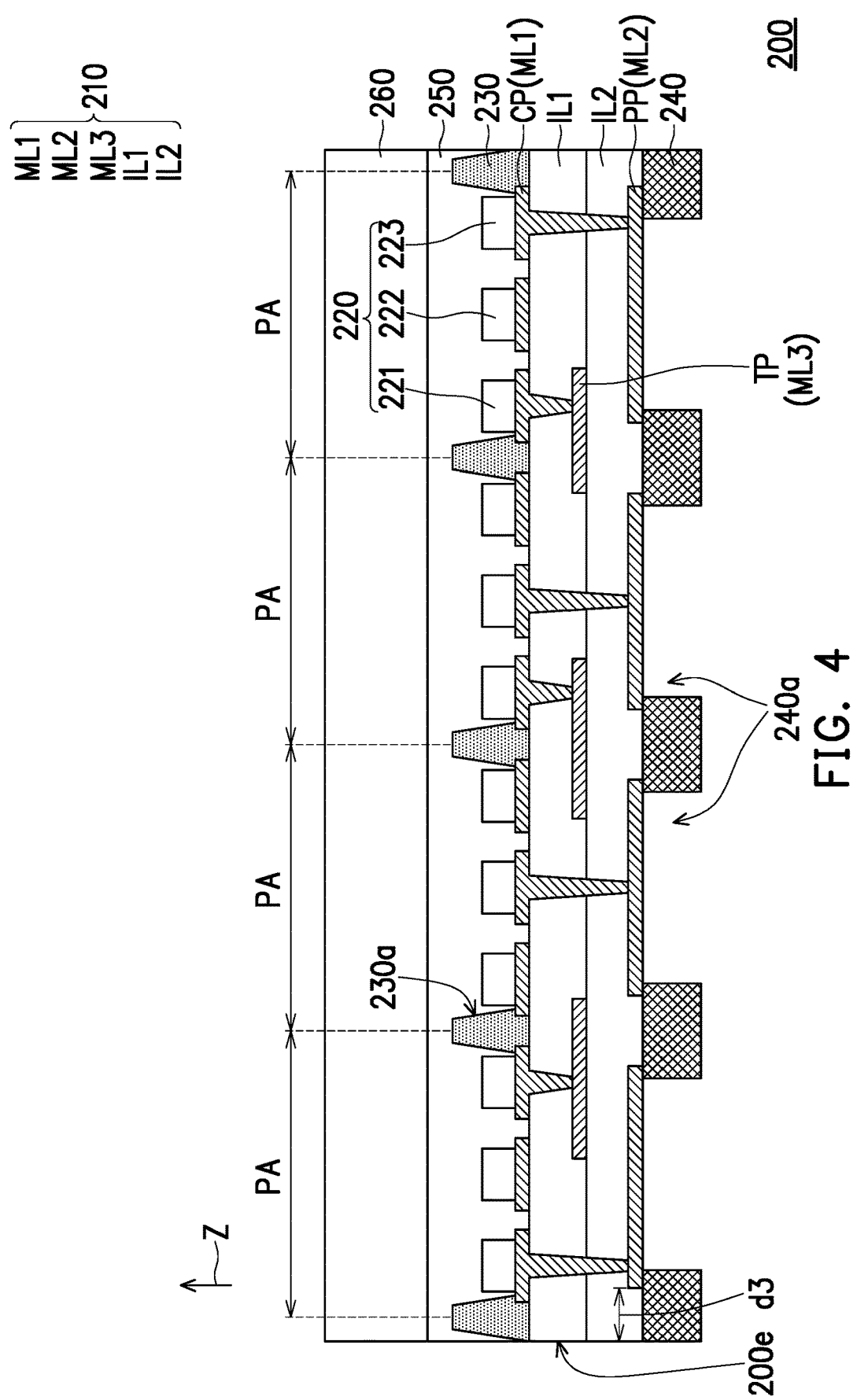
FIG. 4 is a cross-sectional schematic view of light emitting display units of FIG. 1.
Figure 5:
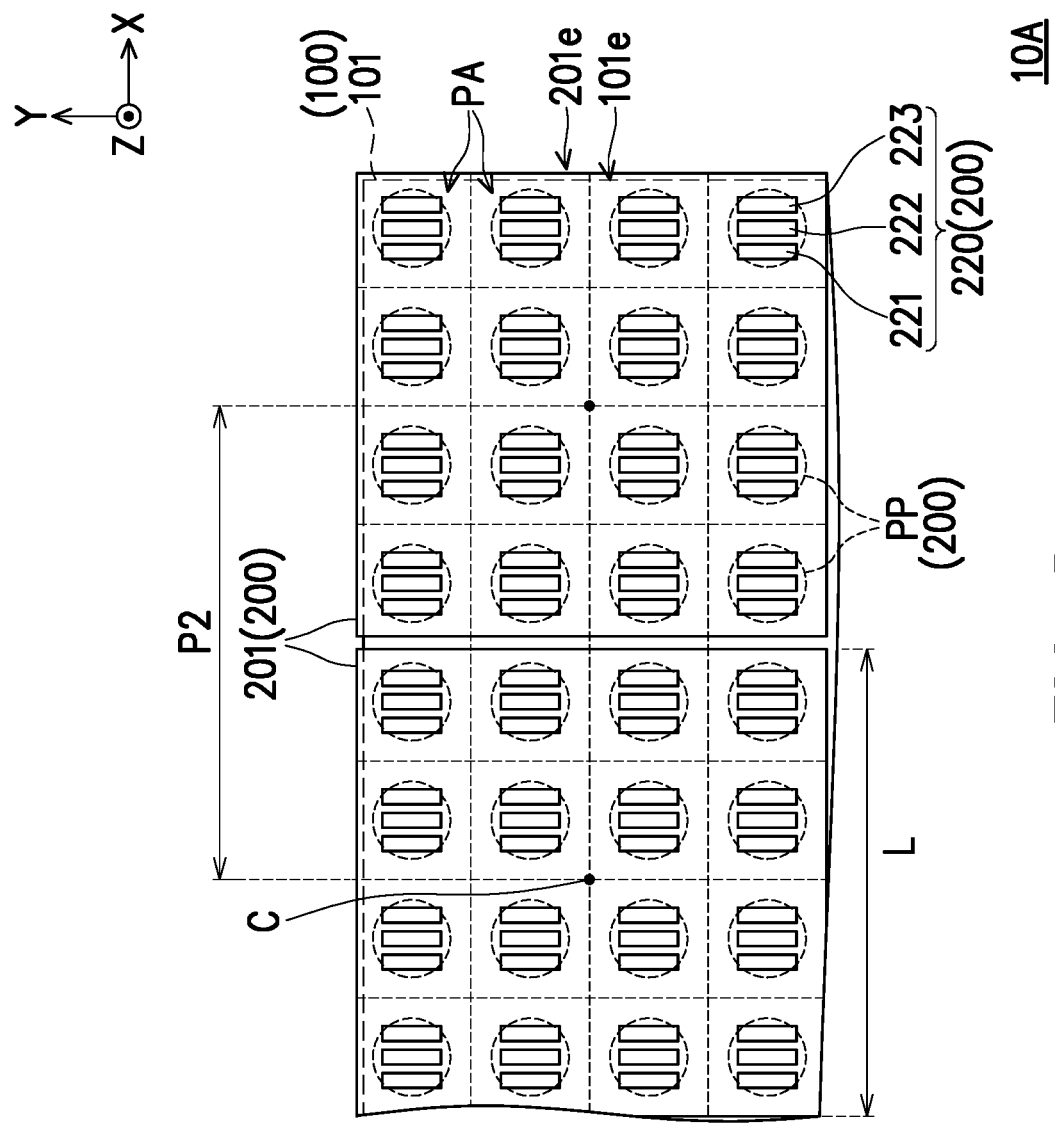
FIG. 5 is a front schematic view of a display apparatus according to another embodiment of the disclosure.

FIG. 1 is a front schematic view of a display apparatus according to a first embodiment of the disclosure. FIG. 2 is an enlarged schematic view of a local region of the display apparatus of FIG. 1. FIG. 2 corresponds to a region I of FIG. 1. FIG. 3 is a cross-sectional schematic view of the display apparatus of FIG. 1. FIG. 3 corresponds to a cross-sectional line A-A' of FIG. 1. FIG. 4 is a cross-sectional schematic view of light emitting display units of FIG. 1. FIG. 5 is a front schematic view of a display apparatus according to another embodiment of the disclosure. For clarity and description, only a light emitting device 220 and a pad structure PP of FIG. 4 are illustrated in a light emitting display unit 200 of FIG. 2, and illustration of detailed members of the light emitting display unit 200 of FIG. 4 is omitted in FIG. 3.

With reference to FIG. 1 to FIG. 4, a display apparatus 10 includes a plurality of circuit boards 100 and a plurality of light emitting display units 200. These light emitting display units 200 are disposed on surfaces 100s of the circuit boards 100 separated from one another. For instance, in this embodiment, these circuit boards 100 are arranged into a plurality of rows and a plurality of columns (e.g., two rows and three columns) in a direction X and a direction Y, and these light emitting display units 200 are also arranged into a plurality of row and a plurality of columns (e.g., three rows and three columns) in the direction X and the direction Y. Note that in this embodiment, a number of circuit boards 100 of the display apparatus 10 and a number of light emitting display units 200 disposed on each of the circuit boards 100 are respectively six and nine as examples for description, which does not mean that the disclosure is limited to the disclosed drawings. In other embodiments, the number of the light emitting display units 200 disposed on each of the circuit boards 100 may be adjusted according to actual product design.

Each of the light emitting display units 200 includes a driving circuit layer 210 and a plurality of light emitting devices 220. One side of the driving circuit layer 210 is electrically bonded to the circuit board 100. These light emitting devices 220 are disposed on another side of the driving circuit layer 210 away from the circuit board 100 and are independently controlled by the circuit board 100 and the driving circuit layer 210. To be specifically, a display effect provided by the display apparatus 10 is achieved through the light emitting display units 200 spliced to each other, and light emitting intensity of the light emitting devices 220 on the light emitting display units 200 may be controlled by plural (e.g., nine) circuit boards 100 according to an image intended to be presented. For instance, in this embodiment, each of the light emitting devices 220 may be a micro light emitting diode exhibiting a length of less than 100 microns and a thickness of less than 10 microns, which should however not be construed as limitations to the disclosure.

In this embodiment, each of the light emitting display units 200 may also selectively include an isolation structure layer 230 disposed on the side of the driving circuit layer 210 where the light emitting devices 220 are disposed. The isolation structure layer 230 has a plurality of openings 230a, and the light emitting devices 220 of the light emitting display unit 200 are disposed in the openings 230a of the isolation structure layer 230. To be specifically, these openings 230a of the isolation structure layer 230 may define a plurality of pixel areas PA of the light emitting display unit 200 (or the display apparatus 10). These pixel areas PA are arranged into an array in the direction X and the direction Y.

For instance, the pixel areas PA of each of the light emitting display units 200 are arranged at intervals of a first pitch P1 in the direction X or the direction Y into a plurality of pixel strings (e.g., pixel rows PXR or pixel columns PXC). Number of the pixel areas PA included in the pixel strings extending in the direction X or the direction Y is N (e.g., four). Plural light emitting display units 200 are arranged at intervals of a pitch P2 in the direction X and the direction Y, and the arrangement pitch P1 of the pixel areas PA and the arrangement pitch P2 of the light emitting display units 200 satisfy the following relation formula: P2=N·P1. That is, the arrangement pitch P2 of these light emitting display units 200 is an integer multiple of the arrangement pitch P1 of the pixel areas PA.

Note that in order to achieve favorable display quality, the plurality of light emitting display units 200 on the same circuit board 100 or the plurality of light emitting display units 200 on different circuit boards 100 are arranged at intervals of the same pitch P2 (as shown in FIG. 2). For instance, two light emitting display units 201 (i.e., first light emitting display units) adjacent to each other and located around a circuit board 101 (i.e., a first circuit board) or the light emitting display units 201 located on the circuit board 101 and adjacent to a circuit board 102 (i.e., a second circuit board) and light emitting display units 202 (i.e., second light emitting display units) located on the circuit board 102 and adjacent to the circuit board 101 are both arranged at intervals of the same pitch P2 in the direction X. In other words, even though the display apparatus 10 is spliced by the light emitting display units 200 on the circuit boards 100, all of the pixel areas PA are arranged at intervals of the same pitch P1 in the direction X or the direction Y.

In this embodiment, a number of the light emitting devices 220 disposed in each of the pixel areas PA is three (for example, a light emitting device 221, a light emitting device 222, and a light emitting device 223) configured to emit light of different colors (for example, but not limited to, red light, blue light, and green light). In other embodiment, the number of the light emitting devices 220 disposed in each of the pixel areas PA may be adjusted according to different optical design (for example, types of colors of light emitted by the light emitting devices 220) or product specifications (for example, light emitting brightness).

In this embodiment, a material of the isolation structure layers 230 is, for example, a black resin material or other suitable light-absorbing materials. Accordingly, the light emitted by the light emitting devices 220 in each of the pixel areas PA are prevented from being emitted out from the adjacent pixel area PA, which may result in a decrease in a display contrast ratio. In other words, through arrangement of the isolation structure layers 230, display quality of the display apparatus 10 may be improved, which should however not be construed as limitations to the disclosure. According to other embodiments, the material of the isolation structure layers 230 may include a light reflective material (e.g., a metal material with high reflectivity or a white reflective material). In an embodiment that is not shown, the isolation structure layers 230 may also be implemented through covering of a metal film layer on a photoresist pattern.

Further, the driving circuit layer 210 includes a plurality of metal layers and a plurality of insulating layers. In this embodiment, the driving circuit layer 210 may include a metal layer ML1, a metal layer ML2, an insulating layer IL1, and an insulating layer IL2. The metal layer ML1 is disposed on one side of the driving circuit layer 210 where the light emitting devices 220 are disposed and has a plurality of conductive patterns CP exposed by the openings 230a of the isolation structure layer 230. The light emitting devices 220 are respectively electrically bonded to the conductive patterns CP. The metal layer ML2 is disposed on another side of the driving circuit layer 210 facing the circuit board 100 and has a plurality of pad patterns PP. The pad patterns PP are electrically connected to the conductive patterns CP. The insulating layer IL1 and the insulating layer IL2 are disposed between the metal layer ML1 and the metal layer ML2.

In this embodiment, the driving circuit layer 210 may further include a metal layer ML3 disposed between the insulating layer IL1 and the insulating layer IL2, and the metal layer ML3 has a plurality of transferring patterns TP. For instance, one part of the conductive patterns CP penetrate through the insulating layer IL1 to be connected to these transferring patterns TP and are electrically connected to one part of the pad patterns PP through these transferring patterns TP, and the other part of the conductive patterns CP penetrate through the insulating layer IL1 and the insulating layer IL2 to be electrically connected to the other part of the pad patterns PP directly. Note that in this embodiment, a number of the metal layers of the driving circuit layer 210 is three as an example for description, which does not mean that the disclosure is limited to the disclosed drawings. In other embodiments, the number of the metal layers of the driving circuit layer of each of the light emitting display units may be adjusted to two or four or more according to actual circuit design.

In this embodiment, a plurality of conductive bumps 110 are disposed on the surfaces 100s of the circuit boards 100, and the pad patterns PP of the light emitting display units 200 are electrically bonded to these conductive bumps 110 to be electrically connected to the circuit boards 100. Electrical bonding of the light emitting devices 220 and the conductive patterns CP on the light emitting display units 200 occurs earlier than electrically bonding of the light emitting display units 200 and the circuit boards 100. As such, in a manufacturing process of the light emitting display units 200, the light emitting devices 220 on the light emitting display units 200 may be detected first, and damaged light emitting devices 220 may be repaired. That is, through electrical bonding of the light emitting display units 200 and the circuit boards 100, probability of the display apparatus 10 being scrapped due to failure of transposition of part of the light emitting devices 220 may be effectively reduced, difficulty of repairing of the display apparatus 10 may be reduced, and a production yield of the display apparatus 10 is accordingly increased.

In order to reduce a risk of damaging of the light emitting display units 200 when being bonded to the circuit boards 100 due to pressing (e.g., cracking or line breaking which occurs in part of the film layers of the driving circuit layers 210), each of the light emitting display units 200 may selectively include a protection layer 240. This protection layer 240 has a plurality of openings 240a corresponding to the pad patterns PP to expose portions of the pad patterns PP. The conductive bumps 110 on the circuit boards 100 may extend into these openings 240a to be bonded to these pad patterns PP. A material of the protection layer 240 includes, for example, a black resin material or other suitable organic materials.

Since the light emitting display units 200 are provided with the driving circuit layers 210, a margin of circuit design of the display apparatus 10 is increased, and a bonding region of the light emitting display units 200 for electrically bonding the circuit boards 100 may also be effectively reduced. That is, a distribution range of the pad patterns PP of the light emitting display units 200 may further be drawn back towards a center C (as shown in FIG. 2) of the light emitting display units 200, such that the light emitting display units 200 located around the circuit boards 100 may overlap board edges of the circuit boards 100.

For instance, in this embodiment, the circuit board 101 and the circuit board 102 respectively have a board edge 101e and a board edge 102e opposite to each other in the direction X. The light emitting display units 201 located around the circuit board 101 may protrude from the board edge 101e of the circuit board 101, and the light emitting display units 202 located around the circuit board 102 may protrude from the board edge 102e of the circuit board 102. That is, the light emitting display units 201 overlap the board edge 101e of the circuit board 101 in a direction Z, and the light emitting display units 202 overlap the board edge 102e of the circuit board 102 in the direction Z.

To be specific, each of the light emitting display units 201 has a side edge 201e parallel to the board edge 101e of the circuit board 101, and a spacing S1 is provided between the side edge 201e of the light emitting display unit 201 and the board edge 101e of the circuit board 101 in the direction X. Similarly, each of the light emitting display units 202 has a side edge 202e parallel to the board edge 102e of the circuit board 102, and a spacing S2 is provided between the side edge 202e of the light emitting display unit 202 and the board edge 102e of the circuit board 102 in the direction X. From another prospective, the side edge 201e of the light emitting display unit 201 does not overlap the circuit board 101 in the direction Z, and the side edge 202e of the light emitting display unit 202 does not overlap the circuit board 102 in the direction Z.

Note that the spacing S1 between the board edge 101e of the circuit board 101 and the side edge 201e of the light emitting display unit 201 and the arrangement pitch P1 of the pixel areas PA in the direction X (or the direction Y) satisfy the following relation formula: $0<S1\leq 0.2\cdot P1$. Similarly, the spacing S2 between the board edge 102e of the circuit board 102 and the side edge 202e of the light emitting display unit 202 and the arrangement pitch P1 of the pixel areas PA in the direction X (or the direction Y) satisfy the following relation formula: $0<S2\leq 0.2\cdot P1$. In this embodiment, the spacing S1 between the board edge 101e and the side edge 201e may be substantially equal to the spacing S2 between the board edge 102e and the side edge 202e, which should however not be construed as limitations to the disclosure. It is worth noting that if the spacing S1 and the spacing S2 are excessively large, a connection relationship between the two circuit boards 101 and 102 may not be easily fixed, and structural stability of the display apparatus is thus affected.

On the other hand, since the light emitting display units 200 are provided with the driving circuit layers 210, electrical connection ends of the light emitting devices 220 may be converged to the pad patterns PP through the aforementioned circuit transfer design (i.e., connection relationships among the metal layer ML1, the metal layer ML2, and the metal layer ML3). For instance, a distance d3 between any one of the pad patterns PP adjacent to the side edge (e.g., a side edge 200e) of one of the light emitting display units 200 and the side edge of the light emitting display unit 200 satisfies the following relation formula: $d3>0.2\cdot P1$.

From another perspective, in this embodiment, the side edge 101e of the circuit board 101 is drawn back from the side edge 201e of each of the light emitting display units 201 in a direction opposite to the direction X (i.e., spacing S1 is greater than 0), and the side edge 102e of the circuit board 102 is drawn back from the side edge 202e of each of the light emitting display units 202 in the direction X (i.e., spacing S2 is greater than 0). As such, a joint where two light emitting display units are spliced is formed by the side edge 201e of the light emitting display unit 201 overlapping the board edge 101e of the circuit board 101 and the side edge 202e of the light emitting display unit 202 overlapping the board edge 102e of the circuit board 102. Since the light emitting display units 201 and 202 have thinner thicknesses and better cutting precision than the circuit boards 100, a spliced seam formed by adjacent two light emitting display units is smaller than a spliced seam form by adjacent two circuit boards 101 and 102. In this way, seamless splicing of the light emitting display units 200 on the circuit boards 100 is thereby accomplished, and display quality of the large-sized display apparatus 10 is accordingly improved.

Note that the side edge 201e of each of the light emitting display units 201 and the side edge 202e of each of the light emitting display units 202 do not need to be in contact to be regarded as seamless splicing. As long as the distance d1 between the two edges in the direction X is less than 50 microns and cannot be seen by human eyes, splicing of the two light emitting display units may also be regarded as seamless splicing.

On the other hand, in this embodiment, although a micro gap is provided between any two adjacent light emitting display units 200 shown in FIG. 3, it does not mean that the disclosure is limited to the disclosed the drawings. In other embodiments, a distance between any two adjacent ones of the light emitting display units 200 may be equal to 0. That is, the two opposite side edges of adjacent two light emitting display units 200 contact each other. Accordingly, the light reflected from the circuit boards 100 are prevented from being emitted out from the micro gap between adjacent two light emitting display units 200, so lines on the circuit boards 100 may be well-concealed in a visual direction.

In this embodiment, since the board edges of the circuit boards are drawn back relative to the side edges of the light emitting display units, a distance d2 between the board edge 101e of the circuit board 101 and the board edge 102e of the circuit board 102 in the direction X is greater than the distance d1 between the side edge 201e of each of the light emitting display units 201 and the side edge 202e of each of the light emitting display units 202, and this distance d2 satisfies the following relation formula: d1≤d2≤d1+0.4·P1. Note that in another embodiment, the distance d1 between the side edge 201e of the light emitting display unit 201 and the side edge 202e of the light emitting display unit 202 may be equal to 0 as well. That is, the distance d2 may satisfy the following relation formula: 0≤d2≤0.4·P1 as well.

For instance, the display apparatus 10 may further include at least one connecting member 300 disposed in a gap 100G between the board edge 101e of the circuit board 101 and the board edge 102e of the circuit board 102 to fixedly connect the two circuit boards. It should be understood that both the light emitting display units 201 on the circuit board 101 and the light emitting display units 202 on the circuit board 102 overlap the gap 100G (or the connecting member 300). In this embodiment, the connecting member 300 is, for example, an adhesive layer, and a material of the adhesive layer includes a silicone-based material or an acrylic-based material, which should however not be construed as limitations to the disclosure. In another embodiment, the connecting member 300 may also be a conductive adhesive material to electrically connect the two circuit boards located on two sides of the gap 100G. In still another embodiment, the connecting member 300 of the display apparatus 10 may be replaced by a plurality of magnetic members, and these magnetic members are disposed on bottom surfaces of the circuit boards 100 away from the light emitting display units 200 or/and on board edges in a splicing direction. A display size and a contour of the display apparatus, which is formed by splicing of the circuit boards 100 performed through magnetic relationships among these magnetic members, may be adjusted according to different usage scenarios, and operational flexibility of the display apparatus may thus be improved.

On the other hand, a length L of each of the light emitting display units 200 in the direction X is equal to the arrangement pitch P2 of the light emitting display units 200 in the direction X, and a length L of each of the light emitting display units 200 in the direction Y is equal to the arrangement pitch P2 of the light emitting display units 200 in the direction Y, which should however not be construed as limitations to the disclosure. According to other embodiments, in the display apparatus 10, the length L of each of the light emitting display units 200 in the direction X (or the direction Y) may also be less than the arrangement pitch P2 of the light emitting display units 200 in the direction X (or the direction Y) (as shown in FIG. 5). To be specific, the length L of each of the light emitting display units 200 in the direction X (or the direction Y) satisfies the following relation formula: (N−0.4)·P1<L≤P2.

In this embodiment, each of the light emitting display units 200 may further include an adhesive layer 250 and a color mixing layer 260. The adhesive layer 250 is disposed between the driving circuit layer 210 and the color mixing layer 260 and covers a portion of a surface of the driving circuit layer 210, plural light emitting devices 220, and the isolation structure layer 230. A material of the adhesive layer 250 includes optical clear adhesive (OCA), optical clear resin (OCR), or other suitable optical-based material materials. The color mixing layer 260 is formed by a clear material and is, for example, glass, sapphire, or epoxy, and a thickness of the color mixing layer 260 is greater than 100 microns. Herein, the color mixing layer 260 having a thick thickness may be treated as a light guide layer and may uniformly mix light (e.g., red light, green light, and blue light) emitted by the light emitting devices 220 located in the same pixel area PA, and light emitting uniformity of each of the pixel areas PA is thereby improved.

Some other embodiments are listed below to illustrate the disclosure in detail. Identical reference numerals are used to represent identical components, and descriptions of identical technical contents are omitted. For the omitted parts, description thereof may be found with reference to the foregoing embodiments, which is described in detail below.

Figure 6:
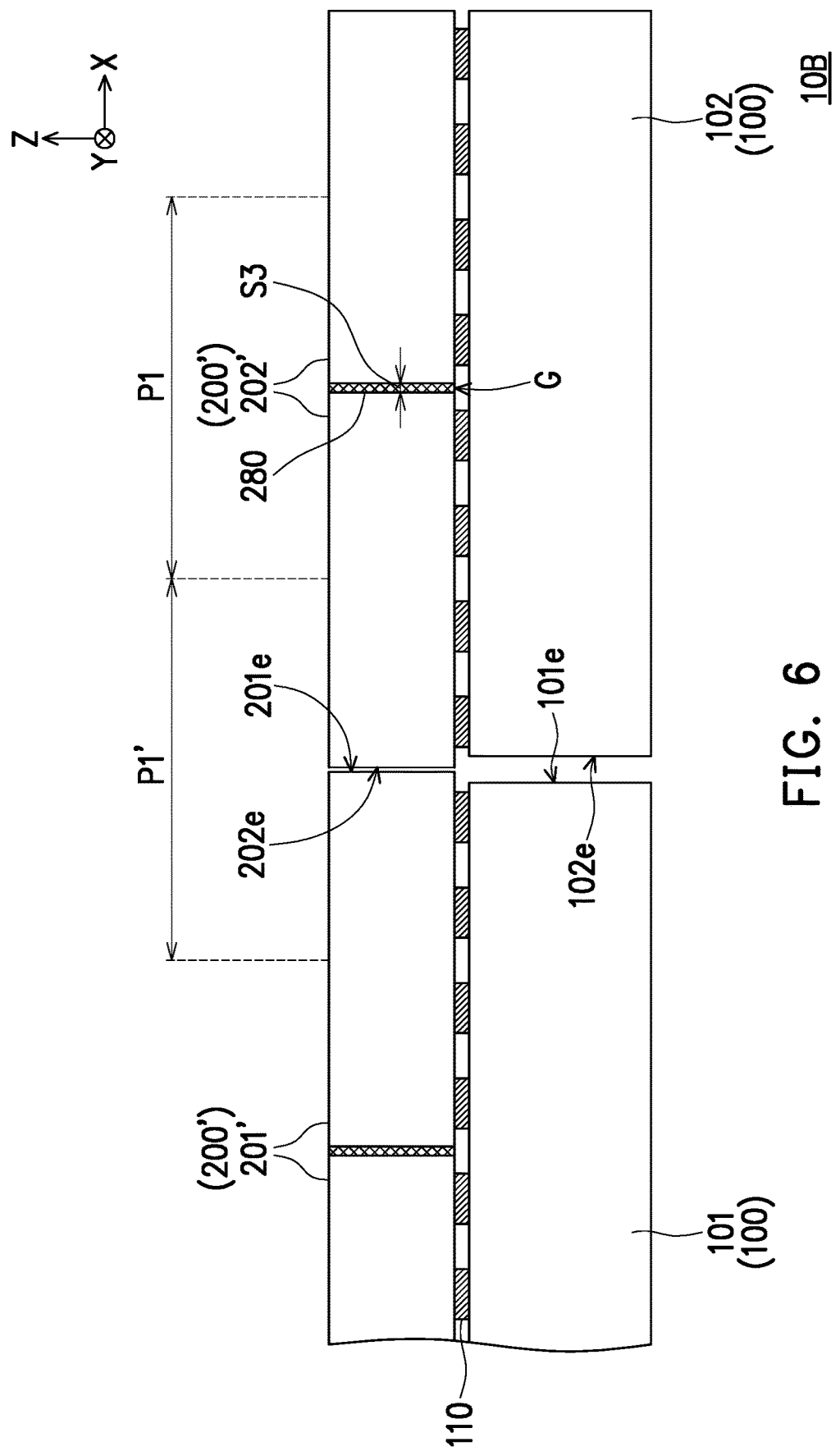
FIG. 6 is a cross-sectional schematic view of a display apparatus according to a second embodiment of the disclosure.

FIG. 6 is a cross-sectional schematic view of a display apparatus according to a second embodiment of the disclosure. With reference to FIG. 6, a difference between a display apparatus 10B of this embodiment and the display apparatus 10 of FIG. 3 is that: light emitting display units 200' of the display apparatus 10B are required to be processed through a cutting process before being transposed to the circuit boards 100. That is, in this embodiment, a clearly visible gap G is provided between any adjacent two of the light emitting display units 200' located on the same circuit board 100. This gap G may act as a buffering space of the light emitting display units 200' for volume expansion caused by heating during a transposition and bonding process, and a transfer yield of the light emitting display units 200' may thus be increased. Note that a spacing S3 of the gap G between any adjacent two light emitting display units 201' (or light emitting display units 202') in an arrangement direction (e.g., direction X) is less than 0.4·P1.

In order to achieve seamless splicing between two circuit boards, an arrangement pitch P1' of the adjacent light emitting display units 201' and the light emitting display units 202' respectively located on the circuit board 101 and the circuit board 102 may be slightly less than an arrangement pitch P1 of the adjacent two light emitting display units 200' located on the same circuit board 100, and such difference of the pitches may be compensated through a picture correction technology.

In this embodiment, a filler 280 (e.g., a black adhesive material) may also be filled in the gaps G among the light emitting display units 200', so that the gaps G may be less visible, which should however not be construed as limitations to the disclosure. In other embodiments, the gaps among plural light emitting display units may not be provided with the filler 280.

Figure 7:
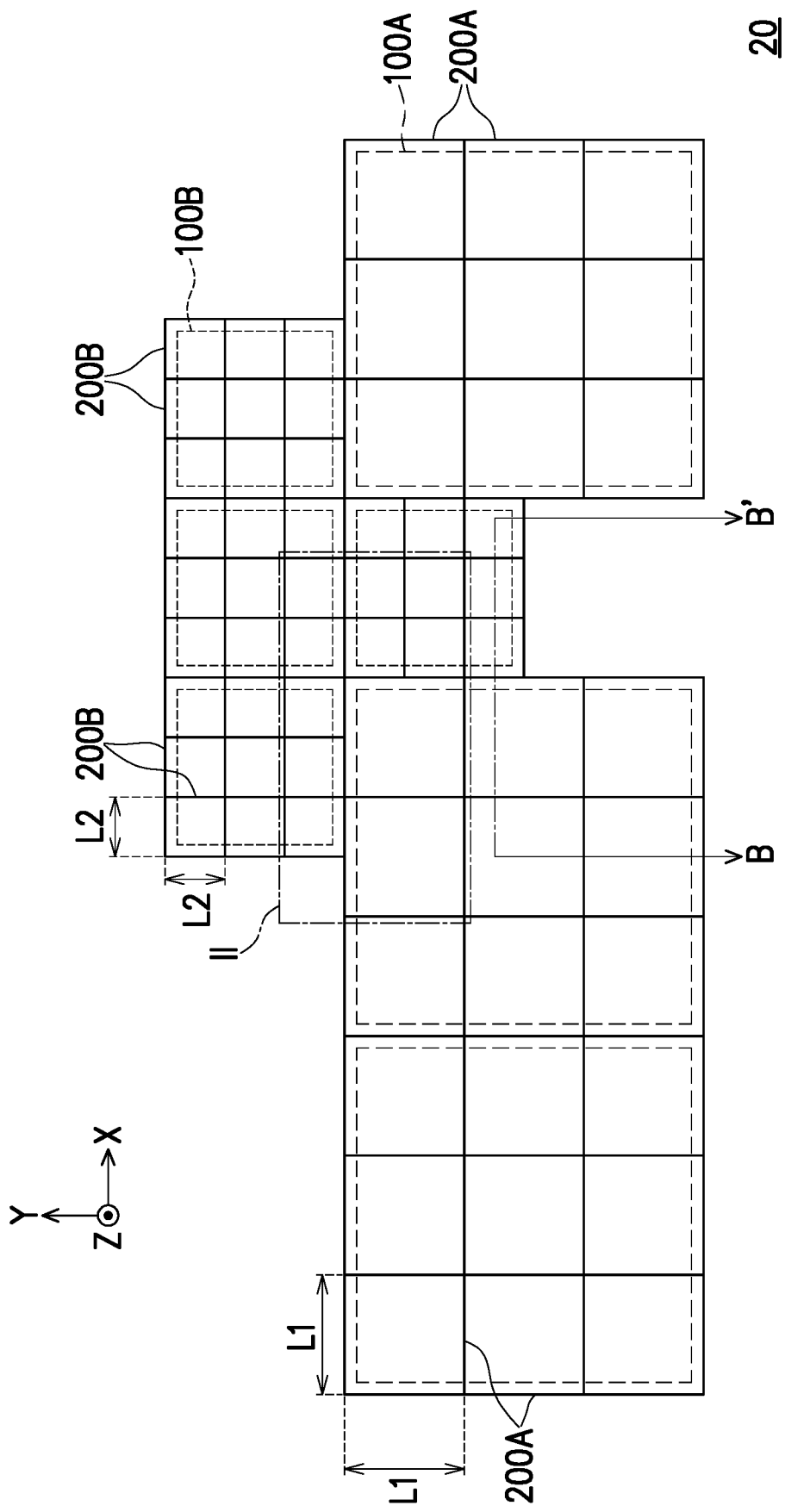
FIG. 7 is a front schematic view of a display apparatus according to a third embodiment of the disclosure.
Figure 8:
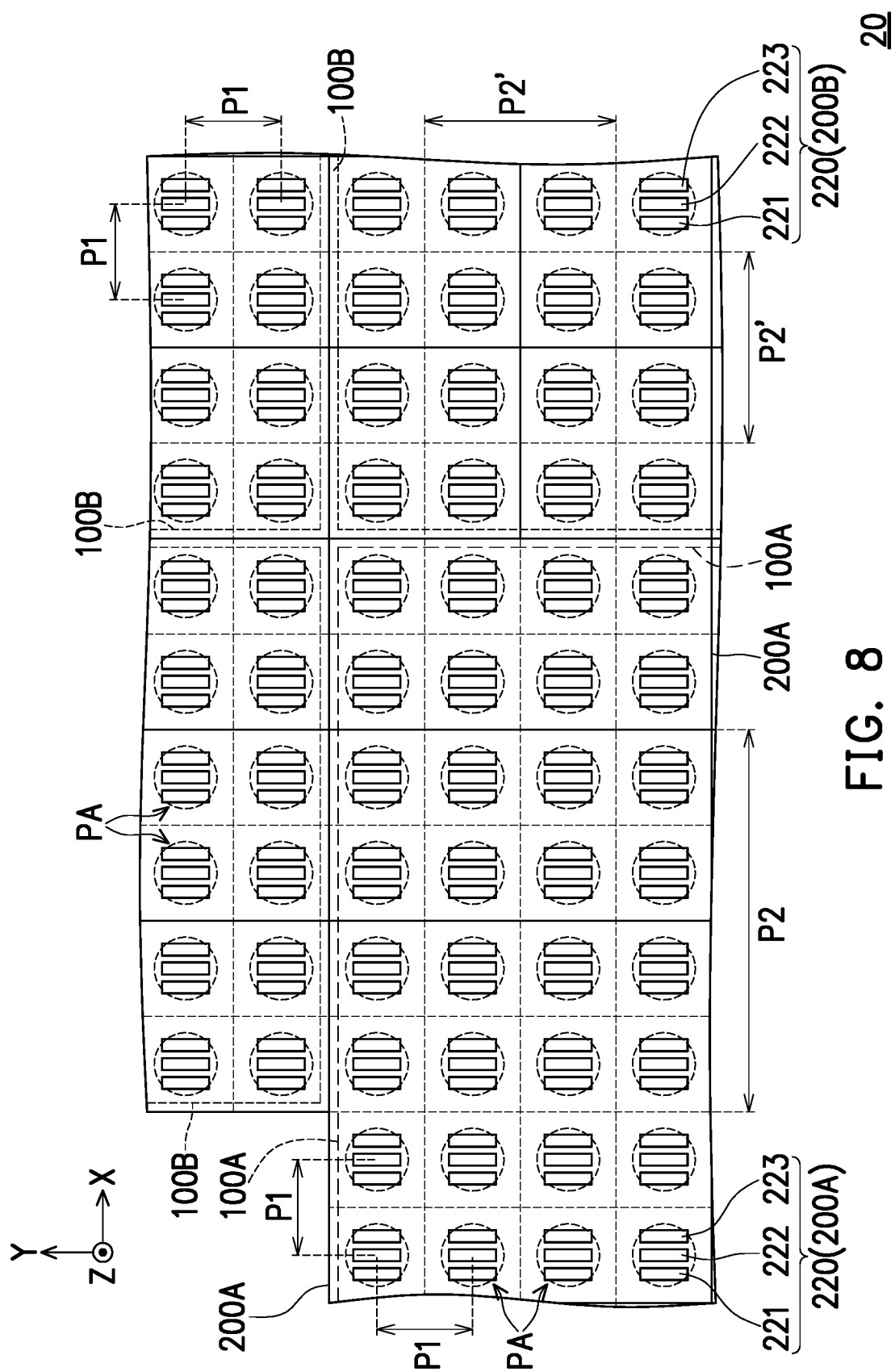
FIG. 8 is an enlarged schematic view of a local region of the display apparatus of FIG. 7.
Figure 9:
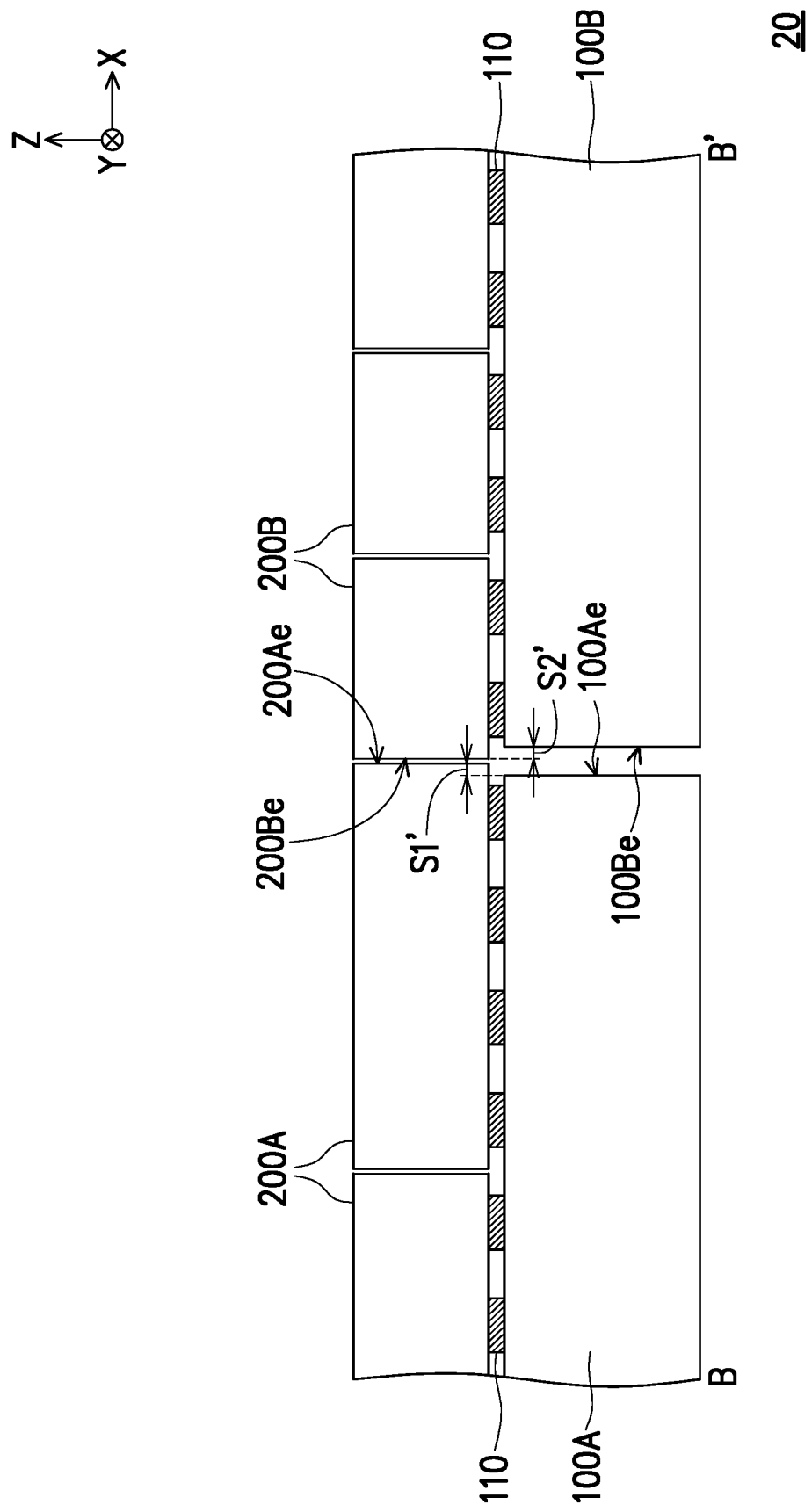
FIG. 9 is a cross-sectional schematic view of the display apparatus of FIG. 7.

FIG. 7 is a front schematic view of a display apparatus according to a third embodiment of the disclosure. FIG. 8 is an enlarged schematic view of a local region of the display apparatus of FIG. 7. FIG. 8 corresponds to a region II of FIG. 7. FIG. 9 is a cross-sectional schematic view of the display apparatus of FIG. 7. FIG. 9 corresponds to a cross-sectional line B-B' of FIG. 7.

With reference to FIG. 7 to FIG. 9, a difference between a display apparatus 20 of this embodiment and the display apparatus 10 of FIG. 1 is that: the display apparatus 20 provides a different structure and a different shape. To be specific, in the visual direction (e.g., direction Z), an outer contour of the display apparatus 20 is non-rectangular, and the non-rectangular contour is formed by splicing of two circuit boards of different sizes. In this embodiment, the display apparatus 20 includes a plurality of circuit boards 100A and a plurality of circuit boards 100B, and sizes of the circuit boards 100A are greater than sizes of the circuit boards 100B. For instance, an area occupied by the circuit boards 100A in the visual direction is approximately four times an area occupied by the circuit boards 100B in the visual direction.

On the other hand, in order to improve transposition flexibility of the light emitting display units on the circuit boards of different sizes, two size types are adopted for the light emitting display units in this embodiment, namely, but not limited to, light emitting display units 200A and light emitting display units 200B. In other embodiments, the size types of the light emitting display units may be adjusted according to actual product design or process requirements. For instance, in an embodiment that is not shown, an outer contour of one circuit board may be non-rectangular as well, and the size types of the light emitting display units on this circuit board may be two to satisfy transposition needs of the light emitting display units on this non-rectangular circuit board.

Structures and formation of the light emitting display units 200A and the light emitting display units 200B provided herein are similar to that of the light emitting display units 200 provided in FIG. 4, so detailed description may be found with reference to related paragraphs of the foregoing embodiments and is not repeatedly provided.

In this embodiment, a length L1 of each of the light emitting display units 200A on the circuit board 100A in the direction X (or the direction Y) is greater than a length L2 of each of the light emitting display units 200B on the circuit board 100B in the direction X (or direction Y). That is, lengths of the light emitting display units 200A and the light emitting display units 200B having different sizes are different in at least one arrangement direction. In other words, in an embodiment that is not shown, the lengths of two types of light emitting display units of different sizes may be identical to each other in one arrangement direction (e.g., the direction X) and may be different from each other in another arrangement direction (e.g., the direction Y).

In order to achieve a uniform display effect, the pixel areas PA of the light emitting display units 200A and the pixel areas PA of the light emitting display units 200B are arranged at interval of the same pitch P1 in the direction X (or the direction Y). To be specific, the length L1 of each of the light emitting display units 200A in the direction X (or the direction Y) is approximately four times the arrangement pitch P1 of these pixel areas PA, and the length L2 of each of the light emitting display units 200B in the direction X (or the direction Y) is approximately two times the arrangement pitch P1 of these pixel areas PA. That is, each of the light emitting display units 200A has sixteen pixel areas PA, and each of the light emitting display units 200B has four pixel areas PA.

Note that in this embodiment, since the light emitting display units 200A and the light emitting display units 200B have different sizes, the arrangement pitches thereof in the direction X or the direction Y are different from each other. For instance, the light emitting display units 200A are arranged at intervals of the pitch P2 in the direction X (or the direction Y), and this pitch P2 is four times the arrangement pitch P1 of the pixel areas PA in the direction X (or the direction Y). The light emitting display units 200B are arranged at intervals of a pitch P2' in the direction X (or the direction Y), and this pitch P2' is two times the arrangement pitch P1 of the pixel areas PA in the direction X (or the direction Y).

In this embodiment, the circuit board 100A and the circuit board 100B respectively have a board edge 100Ae and a board edge 100Be opposite to each other. The light emitting display units 200A located around the circuit board 100A and adjacent to the circuit board 100B and the light emitting display units 200B located around the circuit board 100B and adjacent to the circuit board 100A respectively have side edges 200Ae and side edges 200Be opposite to each other. Note that a spacing S1' between the board edge 100Ae of the circuit board 100A and the side edges 200Ae of the light emitting display units 200A in the direction X is substantially equal to a spacing S2' between the board edge 100Be of the circuit board 100B and the side edges 200Be of the light emitting display units 200B in the direction X. That is, in this embodiment, a degree by which the circuit board 100A is drawn back relative to the light emitting display units 200A is identical to a degree by which the circuit board 100B is drawn back relative to the light emitting display units 200B, which should however not be construed as limitations to the disclosure. In other embodiments, distances by which the light emitting display units of different sizes are drawn back relative to the corresponding circuit boards may also be different, but such distances (i.e., the spacing between the side edges of the light emitting display units and the board edges of the circuit boards) are required to be greater than or equal to 0 and less than or equal to 0.2·P1.

In view of the foregoing, in the display apparatus provided by an embodiment of the disclosure, the light emitting display units are provided with the driving circuit layers. In this way, the margin of circuit design of the display apparatus is increased, and the bonding region of the light emitting display units for electrically bonding the circuit boards may also be effectively reduced. As such, the light emitting display units located around the circuit boards may overlap the board edges of the circuit boards. Accordingly, seamless splicing of the light emitting display units on the circuit boards may be accomplished, and display quality of the large-sized display apparatus is thereby improved. From another perspective, through the electrical bonding of the light emitting display units and the circuit boards, difficulty of repairing of the display apparatus may be lowered. In other words, probability of the display apparatus being scrapped due to failure of transposition (transferring and positioning) of part of the light emitting devices may be effectively reduced, and the production yield of the display apparatus is therefore improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A display apparatus, comprising:
a first circuit board, having a first surface and a first board edge connected to the first surface; and a plurality of first light emitting display units, disposed on the first surface of the first circuit board, wherein each of the first light emitting display units has a plurality of first pixel areas, and comprises:
- a first driving circuit layer, electrically bonded to the first circuit board; and
- a plurality of first light emitting devices, disposed on one side of the first driving circuit layer away from the first circuit board, and electrically bonded to the first driving circuit layer, wherein the first light emitting devices are located in the first pixel areas, wherein at least one of the first light emitting display units has a first side edge parallel to the first board edge, and the first board edge of the first circuit board is drawn back from the first side edge of the at least one of the first light emitting display units.

2. The display apparatus according to claim 1, wherein the first pixel areas of the first light emitting display units are spaced at intervals of a first pitch P1 in a direction, a first spacing S1 is provided between the first side edge of the at least one of the first light emitting display units and the first board edge of the first circuit board in the direction, and a following formula of $0<S1\leq 0.2\cdot P1$ is satisfied.

3. The display apparatus according to claim 1, wherein the first pixel areas of each of the first light emitting display units are arranged into a plurality of pixel strings at intervals of a first pitch P1 in a direction, a number of the first pixel areas contained in the pixel string extending in the direction is N, the first light emitting display units are arranged at intervals of a second pitch P2 in the direction, and a following formula of $P2=N\cdot P1$ is satisfied.

4. The display apparatus according to claim 3, wherein each of the first light emitting display units has a length L in the direction, and a following formula of $(N-0.4)\cdot P1<L\leq P2$ is satisfied.

5. The display apparatus according to claim 1, wherein a gap is provided between any adjacent two first light emitting display units, a filler fills the gap, and the filler is a black adhesive material.

6. The display apparatus according to claim 1, wherein a part of the first light emitting devices located in each of the first pixel areas emit light of different colors.

7. The display apparatus according to claim 1, wherein the first driving circuit layer comprises:
- a first metal layer, disposed on one side of the first driving circuit layer, wherein the first metal layer has a plurality of conductive patterns, and the first light emitting devices are electrically bonded to the conductive patterns; and
- a second metal layer, disposed on another side of the first driving circuit layer, wherein the second metal layer has a plurality of pad patterns, and the first driving circuit layer is electrically bonded to the first circuit board through the pad patterns, wherein the conductive patterns of the first metal layer are electrically connected to the pad patterns of the second metal layer.

8. The display apparatus according to claim 7, wherein each of the first light emitting display units has a color mixing layer disposed on one side of the first light emitting devices away from the first driving circuit layer.

9. The display apparatus according to claim 1, further comprising:
- a second circuit board, having a second surface and a second board edge connected to the second surface; wherein the first board edge of the first circuit board and the second board edge of the second circuit board are opposite to each other; and
- a plurality of second light emitting display units, disposed on the second surface of the second circuit board, wherein each of the second light emitting display units has a plurality of second pixel areas, and comprises:
  - a second driving circuit layer, electrically bonded to the second circuit board; and
  - a plurality of second light emitting devices, disposed on one side of the second driving circuit layer away from the second circuit board, electrically bonded to the second driving circuit layer, wherein the second light emitting devices are respectively located in the second pixel areas, wherein one of the second light emitting display units has a second side edge parallel to the second board edge, the second side edge and the first side edge of the at least one of the first light emitting display units are opposite to each other, and the second board edge of the second circuit board is drawn back from the second side edge of the one of the second light emitting display units, wherein the first light emitting display units and the second light emitting display units respectively on the first circuit board and the second circuit board are spliced and present an image, the first light emitting display units and the second light emitting display units are arranged in a direction, a first distance is provided between adjacent first light emitting display unit and the second light emitting display unit in the direction, a second distance is provided between the first board edge of the first circuit board and the second board edge of the second circuit board, and the second distance is greater than the first distance.

10. The display apparatus according to claim 9, wherein the first pixel areas of the first light emitting display units and the second pixel areas of the second light emitting display units are spaced at intervals of a first pitch in a direction, the first light emitting display units and the second light emitting display units are arranged at intervals of a second pitch in the direction, and the second pitch is an integer multiple of the first pitch.

11. The display apparatus according to claim 9, further comprising:
- at least one connecting member, disposed in a gap between the first board edge of the first circuit board and the second board edge of the second circuit board to fixedly connect the first circuit board and the second circuit board, wherein the one of the first light emitting display units and the one of the second light emitting display units overlap the gap.

12. The display apparatus according to claim 9, wherein sizes of the first circuit board and the second circuit board are different.

13. The display apparatus according to claim 12, wherein a length of each of the first light emitting display units is different from a length of each of the second light emitting display units.

14. The display apparatus according to claim 12, wherein the first pixel areas and the second pixel areas are arranged at intervals of a same pitch.

* * * * *